United States Patent
Hofmann et al.

(10) Patent No.: US 6,576,948 B2
(45) Date of Patent: Jun. 10, 2003

(54) INTEGRATED CIRCUIT CONFIGURATION AND METHOD FOR MANUFACTURING IT

(75) Inventors: Franz Hofmann, München (DE); Wolfgang Krautschneider, Hamburg (DE); Till Schlösser, Dresden (DE); Josef Willer, Riemerling (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/873,231

(22) Filed: Jun. 4, 2001

(65) Prior Publication Data

US 2001/0054727 A1 Dec. 27, 2001

Related U.S. Application Data (63) Continuation of application No. PCT/DE99/03828, filed on Dec. 1, 1999.

(30) Foreign Application Priority Data

Dec. 3, 1998 (JP) .......................... 198 55 878

(51) Int. Cl.⁷ ............................ H01L 27/108
(52) U.S. Cl. ................. 257/311; 257/296; 257/306; 257/309; 257/368; 257/379
(58) Field of Search ................. 257/288, 296, 257/306, 309, 311, 368, 379, 350

(56) References Cited

U.S. PATENT DOCUMENTS

| | | | |
|---|---|---|---|
| 4,902,637 A | | 2/1990 | Kondou et al. |
| 5,463,234 A | | 10/1995 | Toriumi et al. |
| 5,567,962 A | * | 10/1996 | Miyawaki et al. ......... 257/296 |
| 5,640,342 A | * | 6/1997 | Gonzalez ................... 257/903 |
| 5,710,448 A | | 1/1998 | Krautschneider et al. |
| 5,754,077 A | | 5/1998 | Ohata et al. |
| 5,757,051 A | * | 5/1998 | Wu et al. ................... 257/104 |
| 5,796,137 A | * | 8/1998 | Ochii ......................... 257/306 |
| 6,049,105 A | | 4/2000 | Krautschneider et al. |

FOREIGN PATENT DOCUMENTS

| | | |
|---|---|---|
| DE | 197 27 436 C1 | 10/1998 |
| EP | 0 844 671 A1 | 5/1998 |
| WO | WO 92/01287 | 1/1992 |
| WO | WO 00/38235 | 6/2000 |

OTHER PUBLICATIONS

A. V. Krishnamoorthy et al.: "3–D Integration of MQW Modulators Over Active Submicron CMOS Circuits: 375 Mb/s Transimpedance Receiver–Transmitter Circuit", IEEE Photonics Technology Letters, vol. 7, Nov. 1995, No. 11, pp. 1288–1290.

D. H. Cho et al.: "Interconnect Capacitance, Crosstalk, and Signal Delay for 0.35 $\mu$m CMOS Technology", IEDM '96, pp. 619–622, XP–000753819.

(List continued on next page.)

Primary Examiner—Eddie Lee
Assistant Examiner—N. Drew Richards
(74) Attorney, Agent, or Firm—Laurence A. Greenberg; Werner H. Stemer; Ralph E. Locher (57) ABSTRACT

An integrated circuit contains a planar first transistor and a diode. The diode is connected between a first source/drain region of the first transistor and a gate electrode of the first transistor such that a charge is impeded from discharging from the gate electrode to the first source/drain region. A diode layer that is part of the diode is disposed on a portion of the first source/drain region. A conductive structure that is an additional part of the diode is disposed above a portion of the gate electrode and is disposed on the diode layer. The diode can be configured as a tunnel diode. The diode layer can be produced by thermal oxidation. Only one mask is required for producing the diode. A capacitor can be disposed above the diode. The first capacitor electrode of the capacitor is connected to the conductive structure.

9 Claims, 2 Drawing Sheets

OTHER PUBLICATIONS

Jun–ichi Shirakashi et al.: "Fabrication and Characterization of Nb/Nb Oxides–Based Single Electron Transistors (SETs)", Extended Abstracts of the 1996 International Conference on solid State Devices and Materials, Yokohama, 1996, pp. 440–442, XP 000694065.

Kazuhiko Matsumoto: "Room Temperature Operated Single Electron Transistor by STM Nano–Oxidation Process: Fabrication Process and Electrical Properties", IEICE Trans Electron, vol. E79–C, Nov. 1996, No. 11, pp. 1509–1514, XP 000681549.

C.D. Chen et al.: "Aluminum single–electron nonvolatile floating gate memory cell", Appl. Phys. Lett. vol. 71, No. 14, Oct. 6, 1997, pp. 2038–2040, XP–000725852.

* cited by examiner

INTEGRATED CIRCUIT CONFIGURATION AND METHOD FOR MANUFACTURING IT

CROSS-REFERENCE TO RELATED APPLICATION

This application is a continuation of copending International Application No. PCT/DE99/03828, filed Dec. 1, 1999, which designated the United States.

BACKGROUND OF THE INVENTION

Field of the Invention

The invention relates to an integrated circuit configuration and a method for manufacturing it.

Efforts are generally being made to generate an integrated circuit configuration, i.e. a circuit that is integrated in a substrate, with an ever higher packing density.

German Patent DE 197 27 436 C1 describes a DRAM cell configuration in which a memory cell contains a first transistor, a diode structure and a second transistor. The first transistor and the second transistor share between them a common source/drain region and are connected between a voltage terminal and a bit line. A gate electrode of the second transistor is connected to a word line. The diode structure is connected between a gate electrode of the first transistor and the common source/drain region. The transistors are disposed one over the other and are embodied as vertical MOS transistors. The common source/drain region is disposed in a semiconductor structure at whose edges gate electrodes of the transistors in the form of spacers are disposed. The diode structure is composed of a Schottky diode and a tunnel diode which are connected in series. The tunnel diode is formed by the gate electrode of the first transistor, a dielectric layer, which is disposed on the gate electrode of the first transistor, and by a further conductive spacer, which is separated from the gate electrode of the first transistor by the dielectric layer. The Schottky diode is formed by a conductive structure made of metal silicide, which is disposed on an upper part of the further conductive spacer and adjoins the common source/drain region, and by the conductive spacer.

Published, European Patent Application EP 0 537 203 describes a DRAM cell configuration in which a memory cell contains a planar first transistor, a planar second transistor and a voltage-dependent resistor. The first transistor and the second transistor have a common source/drain region and are connected between a voltage terminal and a bit line. A gate electrode of the first transistor is disposed over a gate dielectric and a metal film is disposed over the common source/drain region. The common source/drain region is connected to the gate electrode of the first transistor via the voltage-dependent resistor. The voltage-dependent resistor is, for example, a Schottky junction and is formed by the gate electrode of the first transistor and the metal film. A gate electrode of the second transistor is connected to a word line. The voltage-dependent resistor does not require any additional space, which contributes to increasing the packing density of the DRAM cell configuration.

U.S. Pat. No. 5,463,234 discloses an integrated circuit configuration in which a Schottky diode is connected between a source/drain and a titanium film which extends over a gate electrode. Between the gate electrode and the titanium film there is a silicon film and a titanium silicide film. The titanium silicide film forms on the source/drain the Schottky diode that can, if appropriate, be replaced by a diode with a pn-type junction structure.

Furthermore, U.S. Pat. No. 5,710,448 discloses how a diode contact is to be implemented in such a way that an off-state current flows owing to tunnel processes.

SUMMARY OF THE INVENTION

It is accordingly an object of the invention to provide an integrated circuit configuration and a method for manufacturing it which overcome the above-mentioned disadvantages of the prior art devices and methods of this general type, which has a high packing density.

With the foregoing and other objects in view there is provided, in accordance with the invention, an integrated circuit configuration. The integrated circuit configuration contains a substrate having a main surface and a planar transistor having a first source/drain region and a second source/drain region disposed in the substrate and adjoining the main surface of the substrate. The planar transistor further has a gate electrode disposed above the substrate. A diode is connected between the first source/drain region and the gate electrode such that the diode makes it more difficult for a charge to flow away from the gate electrode to the first source/drain region. The diode has a diode layer containing an insulating material and is disposed on at least part of the first source/drain region. The diode layer has a thickness dimensioned such that a current through the diode layer is produced due to the tunneling of electrodes through the diode layer. The diode further has a conductive structure disposed over at least part of the gate electrode and on the diode layer.

An integrated circuit configuration contains a planar first transistor whose first source/drain region and whose second source/drain region are disposed in a substrate and adjoin a main surface of the substrate. A gate electrode of the first transistor is provided over the substrate. A diode is connected between the first source/drain region and the gate electrode in such a way that it is made more difficult for a charge to flow away from the gate electrode to the first source/drain region. A diode layer, which is part of the diode, is disposed on at least part of the first source/drain region.

A conductive structure, which is a further part of the diode, is disposed over at least part of the gate electrode and on the diode layer.

In a method for manufacturing an integrated circuit configuration, the first source/drain region and the second source/drain region of the planar first transistor are generated by masked implantation of the substrate, in such a way that they adjoin the main surface of the substrate. The gate electrode of the first transistor is formed above the substrate. A diode layer, which is part of the diode, is formed on at least part of the first source/drain region. The conductive structure, which is a further part of the diode, is formed in such a way that it is disposed over at least part of the gate electrode and on the diode layer. The diode is formed in such a way that it is made more difficult for a charge to flow away from the gate electrode to the first source/drain region.

Because the diode is disposed over the first transistor, the integrated circuit configuration can have a high packing density. In contrast to Published, European Patent Application EP 0 537 203, the first transistor can be manufactured in the same way as a transistor using currently customary semiconductor fabrication methods. The diode is manufactured only by the following process steps. The Schottky junction according to European Patent Application EP 0 537 203 must be partially generated before the completion of the transistor because the metal film is disposed under the gate electrode. In addition, the source/drain regions of the transistor according to EP 0 537 203 are not generated by implantation after the gate electrode is formed, as in the conventional method, because the gate electrode is disposed over a greater part of the first source/drain region on which the metal film is located. A further difference with respect to EP 0 537 203 consists in the fact that the gate electrode of the first transistor is not part of the diode so that, owing to the free selection of the material of the conductive structure, electrical properties of the diode can be optimized independently of the gate electrode.

If the integrated circuit configuration contains, in addition to the first transistor and the diode, a second (further) transistor whose first source/drain region is connected to the first source/drain region of the first transistor, the integrated circuit configuration can contain a DRAM cell configuration. The first transistor, the diode and the second transistor are parts of a memory cell of the DRAM cell configuration. The first transistor and the second transistor are connected between a voltage terminal and a bit line. A gate electrode of the second transistor is connected to a word line. The DRAM cell configuration is a dynamic self-amplifying memory cell configuration in this case.

The storage of a logic 1 in the memory cell can be carried out, for example, as follows: a voltage is applied to the bit line and to the word line of the memory cell so that charge flows via the diode to the gate electrode of the first transistor.

In order to store a logic 0 in the memory cell, a voltage is applied to the word line, but not to the bit line, so that current cannot flow via the diode to the gate electrode of the first transistor.

In order to read out the information, a voltage is applied to the word line and to the bit line and a test is conducted to determine whether or not a current is flowing through the bit line. If the logic 1 is stored in the memory cell, the first transistor is switched on owing to the charge on the gate electrode of the first transistor, so that a current can flow from the voltage terminal to the transistors and through the bit line. The charge is held on the gate electrode of the first transistor during the reading-out process because the polarity of the diode is disposed such that the charge can flow away via the diode only with difficulty. If the logic 0 is stored in the memory cell, no current flows through the bit line because the first transistor is switched off owing to a lack of charge at its gate electrode.

If the integrated circuit configuration contains a DRAM cell configuration, it is advantageous for the sake of reducing the process expenditure for the second transistor also to be planar. The source/drain regions and the gate electrodes of the transistors can then be generated simultaneously. In order to increase the packing density, it is particularly advantageous for the first source/drain region of the first transistor and the first source/drain region of the second transistor to be embodied as a common source/drain region. The gate electrode of the second transistor may be part of the word line.

The diode layer may contain, for example, a conductive material so that the diode is a Schottky diode.

So that the flow of the current through the diode is independent of the temperature, it is advantageous for the diode to be embodied as a tunnel diode. For this purpose, the diode layer contains an insulating material. The thickness of the diode layer is dimensioned here in such a way that a current through the diode layer is produced, essentially owing to tunneling of electrodes through the diode layer. The diode layer is composed, for example, of $SiO_2$ and is preferably thinner than 3 nm. The $SiO_2$ can be deposited or grown by thermal oxidation. The diode layer may contain nitride or silicon nitride. The diode layer may also contain a plurality of component layers. The diode is formed by the first source/drain region of the first transistor, the diode layer and the conductive structure. In contrast to the diode structure of the DRAM cell configuration according to German Patent DE 197 27 436 C1, the diode contains only three elements and can be manufactured with a smaller process expenditure.

One possible way of disposing the polarity of the diode such that it is made more difficult for current to flow from the gate electrode of the first transistor to the first source/drain region of the second transistor consists in providing a smaller doping concentration for the conductive structure than for the first source/drain region of the first transistor. The conductive structure and the first source/drain region of the first transistor are of the same conductivity type.

So that the diode layer is particularly uniform and thin, it can be grown by a rapid thermal nitridation (RTN) process at approximately 1000° C. using $NH_3$. The process limits itself automatically at small thicknesses, i.e. the diode layer which has already been grown on prevents further diffusion of atoms to the main surface of the substrate.

When the diode layer is formed, a further layer can be formed on the gate electrode. The diode layer can be generated, for example, by thermal oxidation so that the further layer is formed on the gate electrode. The further layer is subsequently removed by a masked etching process.

In order to prevent the further layer from being generated on the gate electrode when the diode layer is being generated, a protective structure can be generated on the gate electrode before the diode layer is generated. The protective structure is removed after the diode layer is generated. The gate electrode preferably has a rougher surface than the first source/drain region. For example, the gate electrode can be generated from doped polysilicon and the substrate can contain monocrystalline silicon at least in the vicinity of the first source/drain region. If the diode layer is generated, for example, by thermal oxidation, the further layer is generated on the gate electrode and it grows inhomogeneously owing to the rough surface of the gate electrode. The resistance of the further layer is negligible in comparison to the resistance of the diode layer because, owing to its inhomogeneity, the further layer permits a significantly higher flow of current than the diode layer. The conductive structure is generated on the diode layer and on the further layer. Electrical resistances for the diode are significantly greater than electrical resistances that are formed by the gate electrode, the further layer and the conductive structure. Removing the further layer or generating the protective structure which protects the gate electrode against thermal oxidation, and which is subsequently removed again, is not necessary, with the result that the process expenditure is reduced.

The substrate may contain a different semiconductor material, for example germanium.

The diode layer and the further layer may be formed as parts of insulating material which is applied essentially over the entire surface, for example by unmasked thermal oxidation. In order to generate the conductive structure, the conductive material may be deposited and structured, the insulating material serving as an etch stop. Alternatively, the conductive material is patterned together with the insulating material. In both cases, just one mask, namely the mask for patterning the conductive structure, is required to generate the diode.

It lies within the scope of the invention if, after the first transistor is formed, a lower insulating layer is deposited over the transistor. A depression can be generated in the lower layer so that at least part of the gate electrode and the first source/drain region is exposed. Subsequently, the diode layer and the further layer can be generated by carrying out, for example, the thermal oxidation process. A conductive material can subsequently be deposited. Parts of the conductive material located outside the depression in the lateral direction are removed so that the conductive structure is generated from the conductive material. In order to generate the diode, just one mask is necessary here, namely the mask for generating the depression.

In the text below "height" designates a distance from the main surface of the substrate along an axis running perpendicular to the main surface.

The depression can be filled when the conductive material is deposited. The conductive material outside the depression can be removed by chemical-mechanical polishing. It lies within the scope of the invention if the height of the conductive structure is subsequently reduced by etching back the conductive material. The conductive material can also be deposited in such a way that surfaces of the depression are covered but the depression is not filled. The conductive material outside the depression can be removed by chemical-mechanical polishing.

In order to reduce the resistance of the further layer, it is advantageous if a surface of the further layer is more than approximately twice as large as a surface of the diode layer.

It lies within the scope of the invention if a capacitor whose first capacitor electrode is electrically connected to the conductive structure is disposed over the substrate. A first part of the first capacitor electrode is disposed on an edge of a projection of the first capacitor electrode onto the main surface of the substrate. The first part of the first capacitor electrode extends to a height that is greater than a height up to which a second part of the first capacitor electrode extends, the second part being disposed on along other parts of the projection. The first capacitor electrode consequently has inner edges and outer edges facing away from the projection. The first capacitor electrode is approximately pot-shaped, for example. A capacitor dielectric of the capacitor covers at least the second part of the first capacitor electrode and the inner edges of the first capacitor electrode. A second capacitor electrode of the capacitor adjoins the capacitor dielectric.

The provision of the inner edges of the first capacitor electrode brings about an increase in the capacitance of the capacitor without increasing the space required by the capacitor.

If the integrated circuit configuration contains a DRAM cell configuration, it is particularly advantageous to provide the capacitor as part of the memory cell because the amount of charge stored on the gate electrode of the first transistor can be increased, enabling the information of the memory cell to be stored over a longer time period before the information has to be refreshed.

The height of the first part of the first capacitor electrode may be less than approximately 1000 nm. Because, in contrast to the charge on a storage capacitor of a DRAM cell configuration in which a memory cell contains a transistor and the storage capacitor, the charge on the capacitor does not have to generate the signal on the bit line, but merely has to keep the first transistor in the opened state, the capacitance of the capacitor can be significantly smaller, for example five times smaller, than the capacitance of the storage capacitor. The small height of the first capacitor electrode permits the integrated circuit configuration to contain, in addition to the DRAM cell configuration, a logic circuit that is also disposed in the substrate. An insulating layer that completely covers the capacitor can be deposited and planarized. The first transistor and the second transistor can be generated simultaneously with transistors of the logic circuit.

In order to generate such a capacitor, it lies within the scope of the invention to deposit and planarize a lower insulating layer over the substrate. A depression is generated in the lower layer. The conductive material is deposited conformly to such a thickness that the depression is not filled. The first capacitor electrode is formed from the conductive material by removing the part of the conductive material located outside of the depression in the lateral direction. The first part of the first capacitor electrode is disposed on edges of the depression.

In order to further increase the capacitance of the capacitor without requiring any additional space, it is advantageous for the capacitor dielectric additionally to cover at least parts of the outer edges of the first capacitor electrode. For this purpose, part of the lower layer is removed, for example after the first capacitor electrode is generated, so that parts of the outer edges are exposed.

In order to increase process reliability, it is advantageous for an upper layer to be generated over the lower layer, in which upper layer a further depression, which is disposed over the depression, is generated. The conductive material of the first capacitor electrode is deposited after the further depression is generated. The first capacitor electrode is generated by removing the conductive material outside the depression and the further depression. After the first capacitor electrode is generated, the upper layer is removed. The lower layer may act here as an etch stop so that the process reliability is increased because a short circuit between the substrate and the second capacitor electrode is avoided by removing the lower layer. If the upper layer is not selectively etchable with respect to the lower layer, it lies within the scope of the invention if a middle layer, which serves as an etch stop, is generated between the lower layer and the upper layer.

The further depression can be generated together with the depression. Alternatively, the further depression is generated after the depression is generated.

The depression in which the first capacitor electrode is disposed can coincide with the depression in which the conductive structure of the diode is disposed.

In order to simplify the process, it is advantageous for the first capacitor electrode to coincide with the conductive structure. Moreover, the packing density of the integrated circuit configuration is increased because the capacitor is disposed over the diode and does not require any additional space.

Alternatively, the conductive structure is generated first, and then the first capacitor electrode. This provides the advantage that the conductive structure and the first capacitor electrode may be composed of different materials or have different doping concentrations. The electrical properties of the capacitor and of the diode can consequently be optimized independently of one another.

The conductive structure is composed, for example, of doped polysilicon that has a dopant concentration of between approximately $10^{17}$ cm$^{-3}$ and $10^{19}$ cm$^{-3}$. The dopant concentration determines the current/voltage characteristic of the diode and is adapted to the respective purpose of use of the memory cell. The first capacitor electrode is composed, for example, of doped polysilicon that has the highest possible dopant concentration, for example $10^{20}$ cm$^{-3}$.

It lies within the scope of the invention if the lower layer and the depression in which the conductive structure is formed are generated first. The upper layer, the further depression and the capacitor can be generated subsequently.

The capacitor electrode can contain $SiO_2$, silicon nitride, a ferroelectric material, such as barium strontium titanate (BST) or other materials with a high dielectric constant.

The second capacitor electrode can contain, for example, doped polysilicon, silicided polysilicon and/or a metal.

Other features which are considered as characteristic for the invention are set forth in the appended claims.

Although the invention is illustrated and described herein as embodied in an integrated circuit configuration and a method for manufacturing it, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

In all the figures of the drawing, sub-features and integral parts that correspond to one another bear the same reference symbol in each case. The figures shown are not true to scale. Referring now to the figures of the drawing in detail and first, particularly, to FIG. 1 thereof, there is shown in a first exemplary embodiment, a planar first transistor and a planar second transistor formed from a conventional process on a main surface H of a p-type doped first substrate A made of silicon. A first source/drain region SD of the first transistor and a first source/drain region SD of the second transistor are produced as a common source/drain region (see FIG. 1). The first source/drain region SD of the first transistor, a second source/drain region SD1 of the first transistor and a second source/drain region SD2 of the second transistor have a dopant concentration of approximately $10^{21}$ cm$^{-3}$ and are n-type doped. The second source/drain region SD1 of the first transistor is strip-shaped and is connected to a voltage terminal. A gate electrode G1 of the first transistor and a gate electrode G2 of the second transistor are disposed over the first substrate A and are separated from the first substrate A by a gate dielectric Gd (see FIG. 1). The gate electrodes G1, G2 have a dopant concentration of approximately $10^{20}$ cm$^{-3}$. The gate electrode G2 of the second transistor is part of a strip-shaped word line. Transistors of a logic circuit Q, which is represented schematically in FIG. 1, are generated simultaneously with the two transistors.

$SiO_2$ is deposited to a thickness of approximately 50 nm and etched back in order to generate spacers Sp on edges of the gate electrodes G1, G2 of the transistors.

Figure 1:
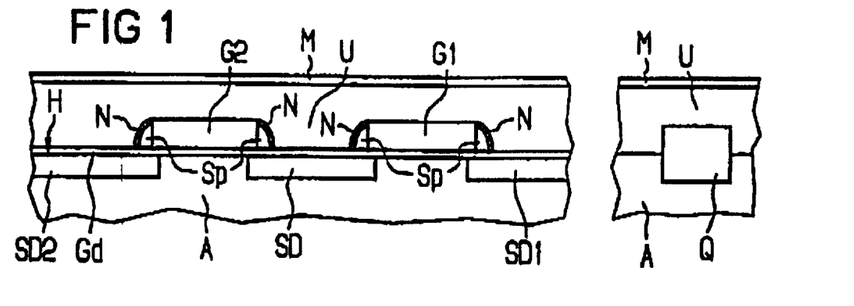
FIG. 1 is a diagrammatic, cross-sectional view through a first substrate after a first transistor, a second transistor, transistors of a logic circuit, a lower layer and a middle layer have been formed according to the invention.

The spacers Sp are provided with a layer N of silicon nitride by depositing silicon nitride to a thickness of approximately 20 nm and etching it back until the gate electrodes G1, G2 of the transistors are exposed (see FIG. 1).

In order to generate an insulating lower layer U, $SiO_2$ is deposited to a thickness of approximately 800 nm by a TEOS method, and is planarized by chemical-mechanical polishing. A middle layer M is generated on the lower layer U by depositing silicon nitride to a thickness of approximately 50 nm (see FIG. 1).

Figure 2A:
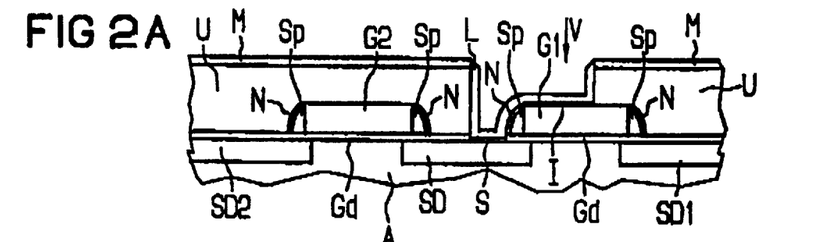
FIG. 2a is a cross-sectional view after a depression, a diode layer, a further layer and a conductive structure have been formed.
Figure 2B:
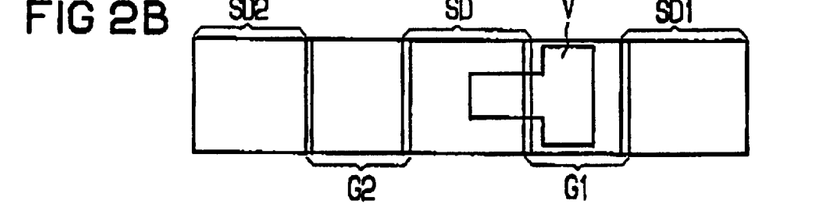
FIG. 2b is a plan view of the first substrate in which the transistors and the conductive structure are represented.

Using a non-illustrated first photoresist mask, the silicon nitride layer M and the $SiO_2$ layer U are etched until a part of the first source/drain region SD of the first transistor, a part of the layer N made of silicon nitride and a part of the gate electrode G1 of the first transistor are exposed so that a depression V is generated whose floor adjoins the first source/drain region SD of the first transistor and the gate electrode G1 of the first transistor (see FIG. 2a). A surface of the exposed part of the gate electrode G1 of the first transistor is approximately twice as large as the exposed part of the first source/drain region SD of the first transistor (see FIG. 2b).

After reduction cleaning with, for example, hydrofluoric acid, thermal oxidation is carried out. A diode layer S made of $SiO_2$, which is approximately 1.5 nm thick, is produced on the first source/drain region SD of the first transistor. In addition, a further layer I is generated on the gate electrode G1 of the first transistor (see FIG. 2a).

In order to generate a conductive structure L, polysilicon doped in situ is deposited to a thickness of approximately 70 nm so that surfaces of the depression V are covered but the depression V is not filled. By chemical-mechanical polishing, the conductive material is removed outside the depression V so that a conductive structure L is formed in the depression V made of the conductive material. The conductive structure L is disposed on the diode layer S of the diode and on the further layer I (see FIGS. 2a and 2b).

The dopant concentration of the conductive structure L is approximately $10^{20}$ cm$^{-3}$. The first source/drain region SD of the first transistor, the diode layer S and the conductive structure L form a diode which is connected between the first source/drain region SD of the first transistor and the gate electrode G1 of the first transistor.

An electrical resistance of the diode is particularly small for a flow of current from the first source/drain region SD of the first transistor to the gate electrode G1 of the first transistor because the current flows through the diode layer S from regions of high doping to regions of low doping. This direction of the flow of current is also referred to as the forward direction of the diode. An electrical resistance of the diode for a flow of current from the gate electrode G1 of the first transistor to the first source/drain region SD of the first transistor is particularly large in comparison with this. The direction of the flow of current is also referred to as the off-state direction of the diode. The diode is consequently connected in such a way that it is difficult for a charge to flow from the gate electrode G1 of the first transistor to the first source/drain region SD of the first transistor.

The effect of the further layer I on the flow of current through the diode is negligible in comparison to the effect of the diode layer S. The reason for this is that the gate electrode G1 of the first transistor is composed of polysilicon and consequently has a rougher surface than the first source/drain region SD of the first transistor which is composed of monocrystalline silicon. The further layer I grows inhomogeneously on the rougher surface so that the further layer I is made such that high leakage currents can flow through it. A further reason for this is that a surface of the further layer I is approximately twice as large as a surface of the diode layer S.

An upper layer O is generated by depositing $SiO_2$ to a thickness of approximately 800 nm. A further depression V*, which is disposed above the depression V, is formed in the upper layer O using a non-illustrated second photoresist mask. The conductive structure L is exposed in the process (see FIG. 3).

Figure 3:
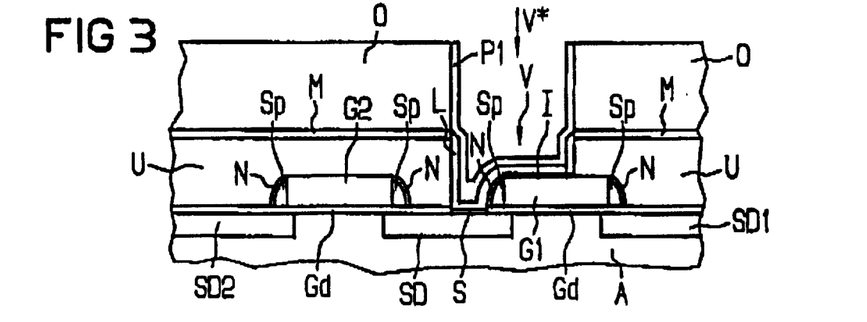
FIG. 3 is a cross-sectional view after an upper layer, a further depression and a first capacitor electrode have been formed.

The generation of the further depression V* is largely tolerant of a maladjustment with respect to the depression V because the etching is selective with respect to the silicon nitride so that parts of the gate electrodes G1, G2 of the transistors and parts of the first substrate A cannot be exposed. The middle layer M acts as an etch stop. $C_2F_6$, for example, is suitable as the etching agent.

In order to generate a first capacitor electrode P1 of a capacitor, in situ doped polysilicon is deposited to a thickness of approximately 50 nm and planarized by chemical-mechanical polishing so that the polysilicon is removed outside the depression V and the further depression V*. The first capacitor electrode P1 is disposed on the conductive structure L.

The upper layer O is subsequently removed selectively with respect to etching of the polysilicon and the silicon nitride by $SiO_2$ so that parts of outer edges of the first capacitor electrode P1 facing away from the centers of the depressions V, V* are exposed (see FIG. 4).

Figure 4:
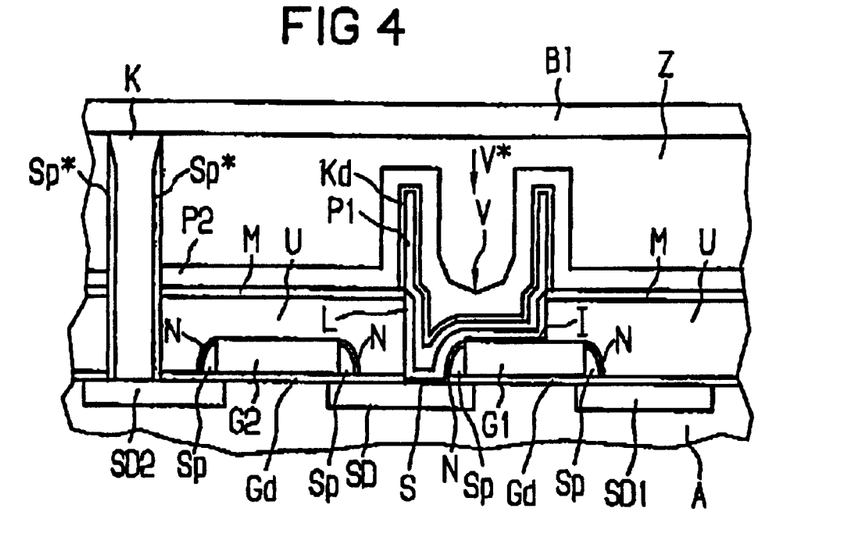
FIG. 4 is a cross-sectional view after a capacitor dielectric and a second capacitor electrode have been formed.

A capacitor dielectric Kd is generated on exposed surfaces of the first capacitor electrode P1 by depositing silicon nitride to a thickness of approximately 7 nm and partially oxidizing it (see FIG. 4).

In order to generate a second capacitor electrode P2, in situ doped polysilicon is deposited to a thickness of approximately 100 nm (see FIG. 4). The second capacitor electrode P2 has a dopant concentration of approximately $10^{20}$ cm$^{-3}$.

By the method described above, a dynamic random access memory (DRAM) cell configuration is generated in which a memory cell contains the first transistor, the second transistor, the diode and the capacitor. An intermediate oxide Z that covers the capacitors is deposited and planarized. In the intermediate oxide Z, contact holes are etched which expose the second source/drain regions SD2 of the second transistors of the memory cells. In order to form further spacers Sp* on edges of the contact holes, $SiO_2$ is deposited to a thickness of 25 nm and etched back. The contact holes are filled with tungsten so that contacts K are formed which are separated from the second capacitor electrode P by the further spacers Sp*. Bit lines B1 that bound the contacts K and run transversely with respect to the word line are generated on the intermediate oxide.

Figure 5:
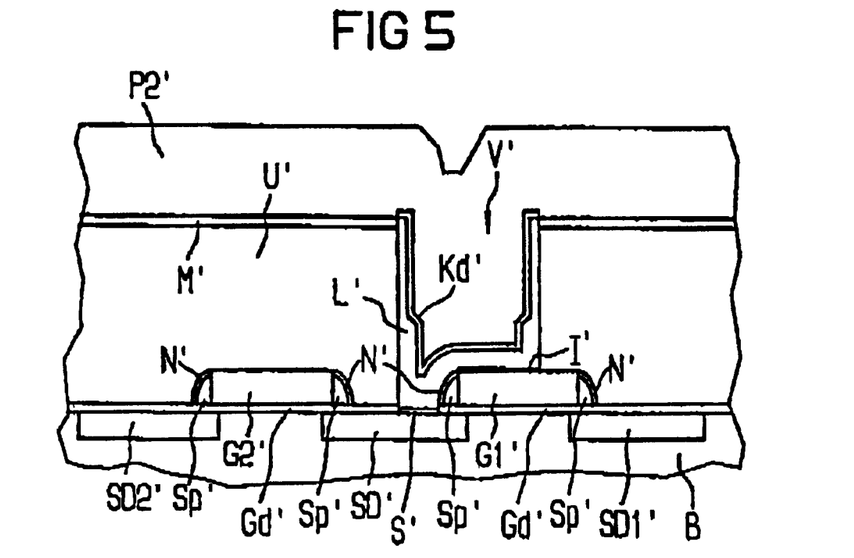
FIG. 5 is a cross-sectional view through a second substrate after the two transistors, the diode and the capacitor have been formed.

In a second exemplary embodiment, in a way corresponding to the first exemplary embodiment, a first source/drain region SD' of a first transistor, which acts at the same time as a first source/drain region of a second transistor, a second source/drain region SD1' of the first transistor, a second source/drain region SD2' of the second transistor, a gate electrode G1' of the first transistor, a gate electrode G2' of the second transistor, a gate dielectric GD', spacers Sp', a layer N' made of silicon nitride, a diode layer S', a further insulating layer I', an insulating lower layer U', a middle layer M', a depression V' and a conductive structure L' are generated on the basis of a second substrate B made of silicon (see FIG. 5). In contrast to the first exemplary embodiment, the thickness of the lower insulating layer U' is, however, approximately 1200 nm. The conductive structure L' serves at the same time as a first capacitor electrode of a capacitor.

In a way corresponding to the first exemplary embodiment, a capacitor dielectric Kd' is generated. Because the outer edges of the first capacitor electrode, i.e. of the conductive structure L', are not exposed, the capacitor dielectric Kd' is generated only on inner edges, facing a center of the depression V', of the conductive structure L' (see FIG. 5).

As in the first exemplary embodiment, a second capacitor electrode P2' is generated by depositing in situ doped polysilicon.

As in the first exemplary embodiment, a DRAM cell configuration, in which a memory cell contains the first transistor, the second transistor, the diode and the capacitor, is also generated here.

A large number of variations of the exemplary embodiments that also lie within the scope of the invention are conceivable. Thus, dimensions of the layers, structures, depressions and regions can be adapted to the respective requirements. The same applies to the dopant concentration and to the selection of materials.

The source/drain regions can be p-type doped, and the substrates can be n-type doped.

It is possible to dispense with the generation of capacitors.

A further possible way of connecting the first source/drain regions to the voltage terminal contains forming, after the second capacitor electrode has been generated, a first intermediate oxide into which contact holes to the second source/drain regions of the first transistors are generated. The contact holes are provided with insulating spacers and filled with tungsten so that contacts are generated. Metal tracks that connect the contacts to the voltage terminal are formed by depositing and patterning conductive material. A further intermediate oxide is subsequently generated and the contact holes for the bit lines are generated in it. Contacts and the bit lines are formed as described above.

We claim:

1. An integrated circuit configuration, comprising:

a substrate having a main surface;

a planar transistor having a first source/drain region and a second source/drain region disposed in said substrate and adjoining said main surface of said substrate, said planar transistor further having a gate electrode disposed above said substrate;

a diode connected between said first source/drain region and said gate electrode impeding a charge to discharge from said gate electrode to said first source/drain region, said diode having a diode layer containing an insulating material and disposed on at least part of said first source/drain region, said diode layer having a thickness generating a current through said diode layer due to tunneling of electrodes through said diode layer, said diode further having a conductive structure disposed over at least part of said gate electrode and on said diode layer; and a capacitor disposed above said substrate and having a first capacitor electrode electrically connected to said conductive structure, said first capacitor electrode having a projection with an edge, a first part, and a second part, said first part disposed on said edge of said projection of said first capacitor electrode onto said main surface of said substrate, said second part disposed on other parts of said projection, said first capacitor electrode having inner edges and outer edges;

said capacitor further having a capacitor dielectric covering at least said second part of said first capacitor electrode and said inner edges of said first capacitor electrode, and a second capacitor electrode adjoining said capacitor dielectric.

2. The integrated circuit configuration according to claim 1, including a further layer disposed between said gate electrode and said conductive structure, said first source/drain region, said diode layer, said conductive structure, said further layer and said gate electrode are produced such that electrical resistances of said diode are significantly greater than electrical resistances which are formed by said gate electrode, said further layer and said conductive structure.

3. The integrated circuit configuration according to claim 2, wherein:

said diode layer has a surface disposed substantially parallel to said main surface; and said further layer has a surface disposed substantially parallel to said main surface and is more than twice as large as said surface of said diode layer.

4. The integrated circuit configuration according to claim 1, wherein said first part extends to a height greater than a height said second part of said first capacitor electrode extends to.

5. The integrated circuit configuration according to claim 4, wherein said capacitor dielectric covers at least parts of said outer edges of said first capacitor electrode.

6. The integrated circuit configuration according to claim 4, wherein said conductive structure coincides with said first capacitor electrode.

7. The integrated circuit configuration according to claim 4, wherein said conductive structure has a projection onto said main surface coinciding with said projection of said first capacitor electrode, said conductive structure having a first part disposed on an edge of said projection of said conductive structure and extends to a height which is greater than a height to which a second part of said conductive structure extends, said second part being disposed on other parts of said projection of said conductive structure, and said first part of said first capacitor electrode being disposed on said first part of said conductive structure.

8. The integrated circuit configuration according to claim 1, including:

a further transistor disposed partially in said substrate and containing a gate electrode, a first source/drain region and a second source/drain region, said first source/drain region of said planar transistor and said first source/drain region of said further transistor are connected to one another, said transistor, said diode and said further transistor forming a memory cell being part of a dynamic random access memory cell configuration;

a voltage terminal;

a bit line, said planar transistor and said further transistor are connected between said voltage terminal and said bit line; and a word line connected to said gate electrode of said further transistor.

9. The integrated circuit configuration according to claim 8, including a logic circuit disposed in said substrate.

* * * * *

UNITED STATES PATENT AND TRADEMARK OFFICE
CERTIFICATE OF CORRECTION

PATENT NO. : 6,576,948 B2 Page 1 of 1
DATED : June 10, 2003
INVENTOR(S) : Franz Hofmann et al.

It is certified that error appears in the above-identified patent and that said Letters Patent is hereby corrected as shown below:

<u>Title page,</u>
Item [30], Foreign Application Priroity Data, should read as follows:

-- Dec. 3, 1998 (DE) ......... 198 55 878 --

Signed and Sealed this

Fourth Day of November, 2003

JAMES E. ROGAN
*Director of the United States Patent and Trademark Office*